US006826840B1

(12) United States Patent
Lindsey et al.

(10) Patent No.: US 6,826,840 B1
(45) Date of Patent: Dec. 7, 2004

(54) SEMICONDUCTOR WAFER SCRIBING SYSTEM

(75) Inventors: Paul C. Lindsey, Lafayette, CA (US); Jeffery D. Atkinson, Sebastopol, CA (US)

(73) Assignee: Micro Processing Technology, Inc., Lafayette, CA (US)

( * ) Notice: Subject to any disclaimer, the term of this patent is extended or adjusted under 35 U.S.C. 154(b) by 0 days.

(21) Appl. No.: 10/462,398

(22) Filed: Jun. 16, 2003

(51) Int. Cl.$^7$ .............................................. B43L 13/00

(52) U.S. Cl. ............................ 33/18.1; 33/503; 33/549

(58) Field of Search .................... 33/18.1, 26, 32.1, 33/501.02, 501.03, 503, 549

(56) References Cited

U.S. PATENT DOCUMENTS

| | | | |
|---|---|---|---|
| 3,094,785 A | | 6/1963 | Kulicke, Jr. |
| 3,680,213 A | * | 8/1972 | Reichert .................... 33/18.1 |
| 4,502,225 A | | 3/1985 | Lin |
| 4,697,348 A | * | 10/1987 | Parent et al. ................ 33/18.1 |
| 4,825,555 A | * | 5/1989 | Murayama et al. .......... 33/18.1 |
| 5,820,006 A | | 10/1998 | Turner |
| 2003/0177650 A1 | * | 9/2003 | Ishikawa et al. ............. 33/18.1 |

* cited by examiner

Primary Examiner—G. Bradley Bennett
Assistant Examiner—Madeline Gonzalez
(74) Attorney, Agent, or Firm—Thomas R. Lampe

(57) ABSTRACT

A method and apparatus for scribing a fixed, stationary semi-conductor wager wherein a multi-stage gantry is employed to move a scribe tool relative to the wafer. The force applied to the wafer by the scribe tool is controlled by an encoder detecting flexing of a scribe tool holder.

25 Claims, 5 Drawing Sheets

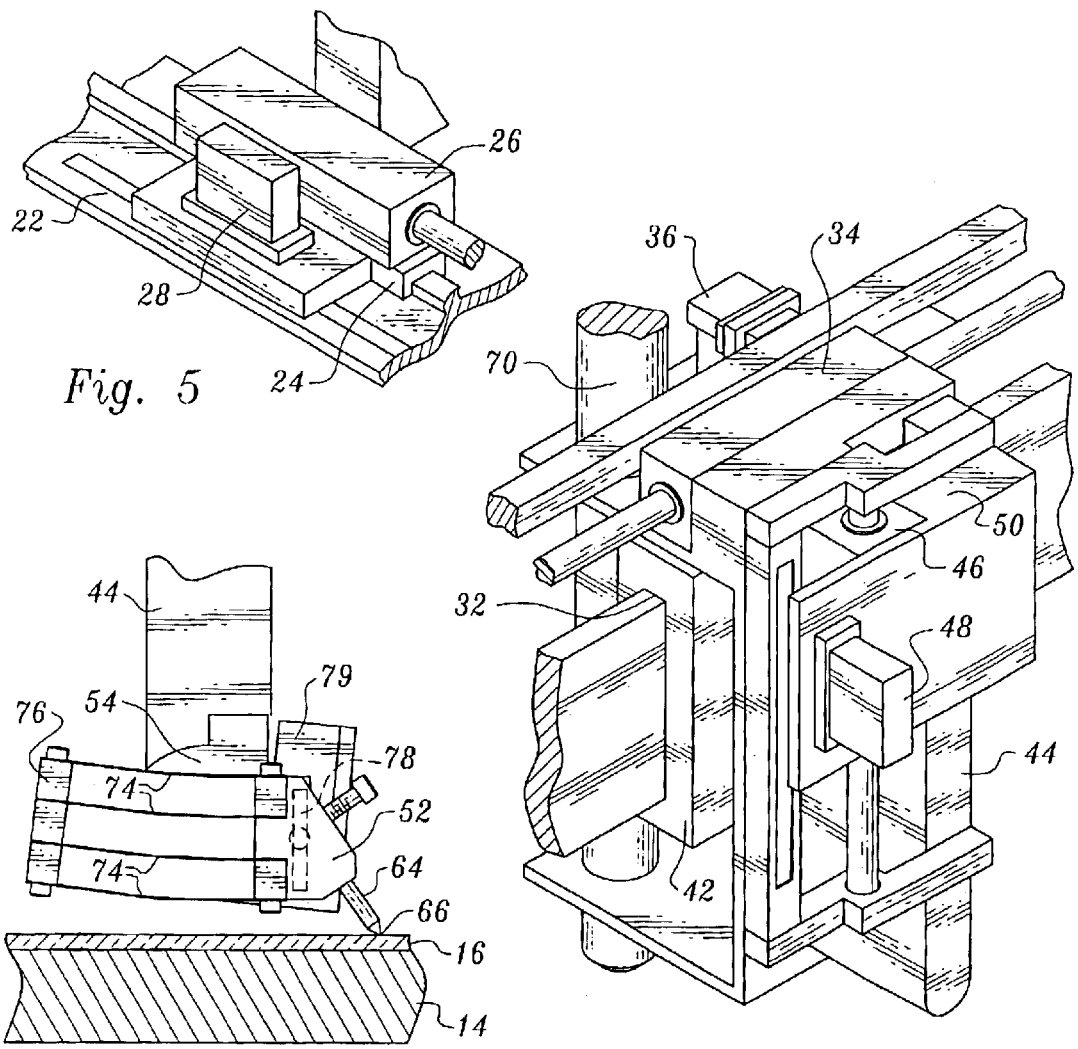
Fig. 5
Fig. 6
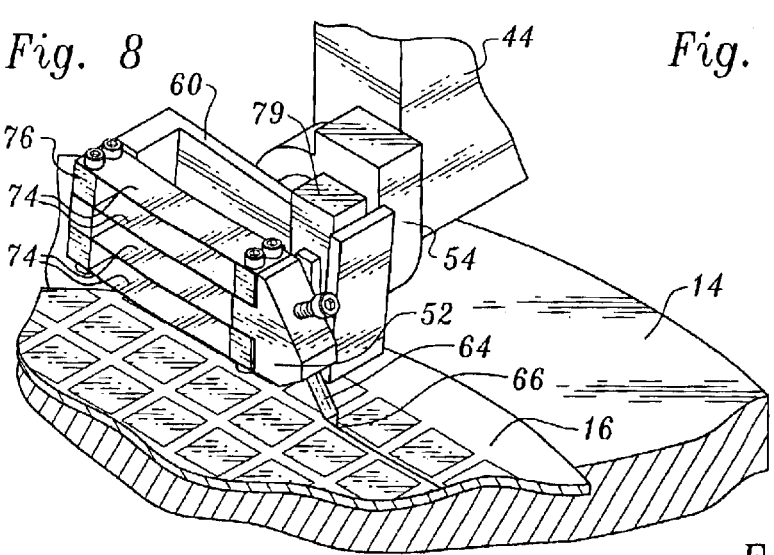
Fig. 8
Fig. 7

SEMICONDUCTOR WAFER SCRIBING SYSTEM

TECHNICAL FIELD

This invention relates to the manufacture of semiconductor devices and circuits and more particularly to an apparatus and method for scribing semiconductor wafers.

BACKGROUND OF THE INVENTION

After devices or circuits are fabricated on a semiconductor wafer, the individual devices or circuits are usually separated from each other by sawing with a diamond-coated saw blade or by scribing the wafer with a sharply pointed diamond scribe and fracturing the wafer along the scribed lines. In certain types of devices or semiconductor materials, scribing and cleaving is the preferred method of separating the individual units on the semiconductor wafer.

In order to scribe a semiconductor wafer, the diamond scribe tip is placed on the surface of the wafer near the distal edge of the wafer and the wafer and diamond scribe tip are moved laterally relative to each other for a distance equal to the entire width of the wafer, forming a scribe line. The diamond scribe tip is raised from the surface of the wafer and the diamond scribe tip and the wafer are indexed relative to each other in the direction perpendicular to the scribe line for a distance equal to the width of an individual device. The diamond scribe tip is again placed on the surface of the wafer and the wafer and the wafer and diamond scribe tip are moved laterally relative to each other again for a distance equal to the entire width of the wafer forming a second scribe line. This process continues until the proximal edge of the wafer surface is reached. The wafer is then rotated 90 degrees and the process described above is repeated.

Current apparatus used to scribe semiconductor wafers provide the motion of the diamond scribe tip relative to the surface of the wafer by holding the diamond tip fixed in one or both lateral directions and moving the table on which the wafer is mounted in one or both of the lateral directions. This approach is evident in Kulicke, U.S. Pat. No. 3,094,785, and Turner, U.S. Pat. No. 5,820,006. This method worked well when semiconductor wafers were small. However, as the wafer diameters have gotten much larger, to 200 mm and 300 mm diameter, the size and weight of the mechanism needed to move the larger table holding the wafer has increased dramatically. This makes it difficult to precisely control the position of the diamond scribe tip relative to the surface of the wafer and requires slowing the motion of the mechanism in order to maintain adequate control.

One of the most important process parameters in achieving a successful scribe line in the surface of the wafer, which in turn results in a successful cleave, is the scribe force applied to the diamond scribe tip. Several different methods have been used to control the scribe force in different scribe apparatus. Kulicke, in U.S. Pat. No. 3,094,785, uses changeable weights acting on the scribe arm that in turn applies force to the scribe tip. Lin, in U.S. Pat. No. 4,502,225, uses a series of levers and springs to apply the scribe force. Other apparatus use air pressure acting on the scribe arm to control the scribe force. Turner, in U.S. Pat. No. 5,820,006; describes a method of electronically controlling the scribe force by using a load cell mounted in a voice coil. Since load cells are analog devices, this approach will not work well, as the electrical noise from the motor drive system will interfere with the analog output from the load cell.

DISCLOSURE OF INVENTION

The purpose of this invention to provide a system to scribe semiconductor wafers, in order to separate them into individual devices, that provides more precise control over the motion of a diamond scribe tip relative the surface of a semiconductor wafer. The second purpose of this invention is to provide a system to precisely control the scribe force applied between the diamond scribe tip and the surface of the wafer.

Unlike prior art, in apparatus constructed in accordance with the teachings of the present invention, the rotary stage, on which the semiconductor wafer is held, is rigidly affixed to a base plate. The diamond scribe tip is moved relative to the surface of the wafer using a gantry arrangement whereby motion stages using linear motors and linear encoders are used to precisely position the diamond scribe tip relative to the surface of the wafer. In this configuration the weight of the moving portion of the apparatus is much less than in prior art. This allows the stages to be moved faster and with more precision. This results in better control of the characteristics of the scribe line and higher wafer throughput for greater manufacturing efficiencies.

The force applied to the surface of the semiconductor wafer by the scribe tip is measured and controlled by a unique structure. The measurement of the force is accomplished using a plurality of flexible beams whose deflection is measured precisely using a linear encoder. The applied force is controlled using a linear motor that is part of a vertical motion stage that supports the force measuring apparatus.

Other features, advantages and objects of the present invention will become apparent with reference to the following description and accompanying drawings.

BRIEF DESCRIPTION OF DRAWINGS

FIG. 5 is an enlarged, perspective view of that portion of the apparatus delineated by line 5—5 in FIG. 1;

FIG. 6 is an enlarged, perspective view of that portion of the apparatus delineated by line 6—6 in FIG. 2;

FIG. 7 is an enlarged, perspective view illustrating the scribe and scribe holder of the present invention along with associated structure in the process of scribing a semiconductor wafer;

FIG. 8 is a side, elevational view of the scribe holder when scribing the wafer;

BEST MODE FOR CARRYING OUT THE INVENTION

Figure 1:
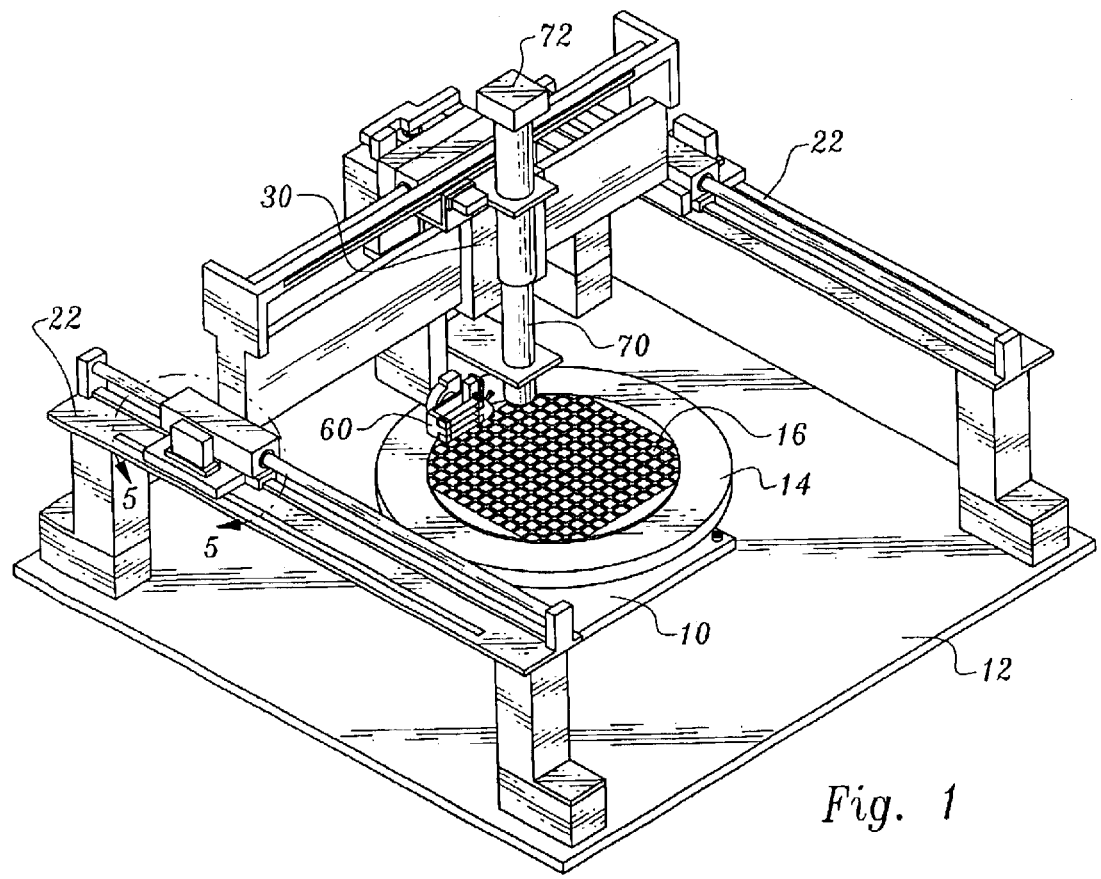
FIG. 1 is a frontal, perspective view of apparatus constructed in accordance with the teachings of the present invention.
Figure 2:
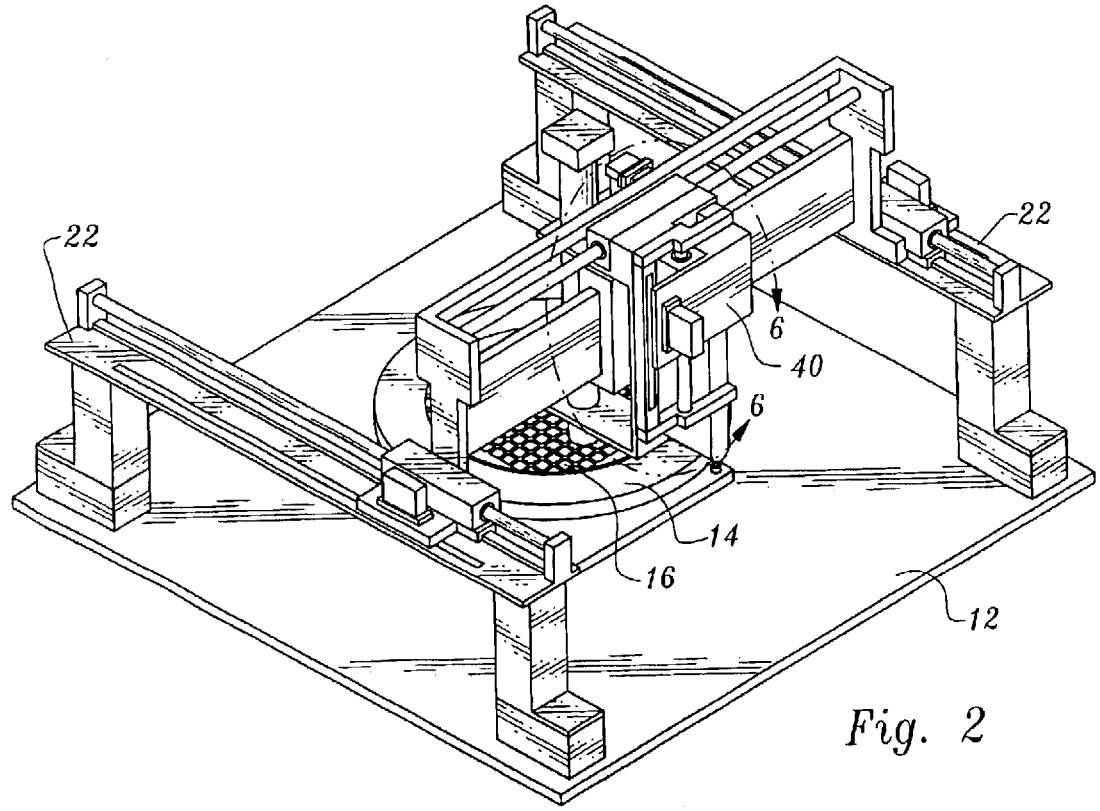
FIG. 2 is a rear, perspective view of the apparatus.

Referring now to the drawings, apparatus constructed in accordance with the present invention includes a precision rotary stage or wafer support 10 is rigidly mounted to a base plate 12 with the axis of rotation thereof normal to the surface of the base plate. A porous ceramic vacuum chuck 14 is mounted on top of the rotary stage 10. The semiconductor wafer 16 to be scribed is placed on the vacuum chuck 14.

A multi-stage gantry 20 consisting of three precision linear stages is mounted on the base plate 12 adjacent to the wafer support. The first linear stage of the gantry is comprised of a pair of first linear stage side segments 22 disposed at opposed sides of the wafer support. Each linear stage side segment includes a high precision bearing 24, a linear motor 26, and a high precision linear encoder 28. In the preferred embodiment of the invention, the precision bearing 24 may be an air bearing or an ultra high precision rail and block bearing using recirculating balls or rollers. The linear motor 26 may be a U-channel style of linear motor, a thrust tube style of linear motor, or a piezoelectic linear motor.

A second linear stage, the cross stage 30 of the gantry, is comprised of a high precision bearing 32, a linear motor 34, and a high precision linear encoder 36. In the preferred embodiment of the invention, the precision bearing 32 is an air bearing. The linear motor 34 may be U-channel style of linear motor, a thrust tube style of linear motor, or a piezoelectic linear motor.

A third precision linear stage 40 is mounted vertically on the bearing block 42 of the gantry cross stage bearing 32. The vertical stage 40 is comprised of a high precision bearing including shaft 44, a linear motor 46, and a high precision linear encoder 48. In the preferred embodiment of the invention, the precision bearing is an air bearing. The linear motor 46 may be a U-channel style of linear motor, a thrust tube style of linear motor, or a piezoelectric linear motor. The vertical stage is mounted differently than the other linear stages. The bearing block 50 of the vertical stage is rigidly mounted to the bearing block 42 of the cross stage while the vertical stage air bearing shaft 44 is allowed to move.

The force measurement structure 60 is mounted at the lower end of the vertical stage air bearing shaft 44 by a small, high precision rotary stage 54. Force measurement structure 60 is on the rotary stage. The scribe tool holder 52 at the end of the force measurement structure 60 provides a means to hold a diamond scribe tool 64 which is comprised of a diamond scribe tip 66 mounted on one end of a stainless steel shaft.

A high power microscope 70 is mounted on the cross stage bearing block 42 and a video camera 72 is mounted on the top of the microscope.

The invention incorporates a unique force measurement and control arrangement. With particular reference to FIGS. 7–11, parallel flexible strips or beams 74 are held at one end of thereof in a rigid mount 76 incorporated on the scribe tool holder. The flexible beams comprise part of the scribe tool holder and are located between the scribe tool and the rigid mount 76, allowing deflection of the tool holder. An encoder scale 78 is mounted on the rear side of the scribe tool holder 52. Located on the rigid mount 76, in a position to view the encoder scale, is a precision linear encoder 79. The rigid mount 76 is connected to the end of the vertical air bearing shaft 44 by way of the small, high precision rotary stage 54., The vertical air bearing shaft 44 is moved by the vertical stage linear motor 46.

Figure 12:
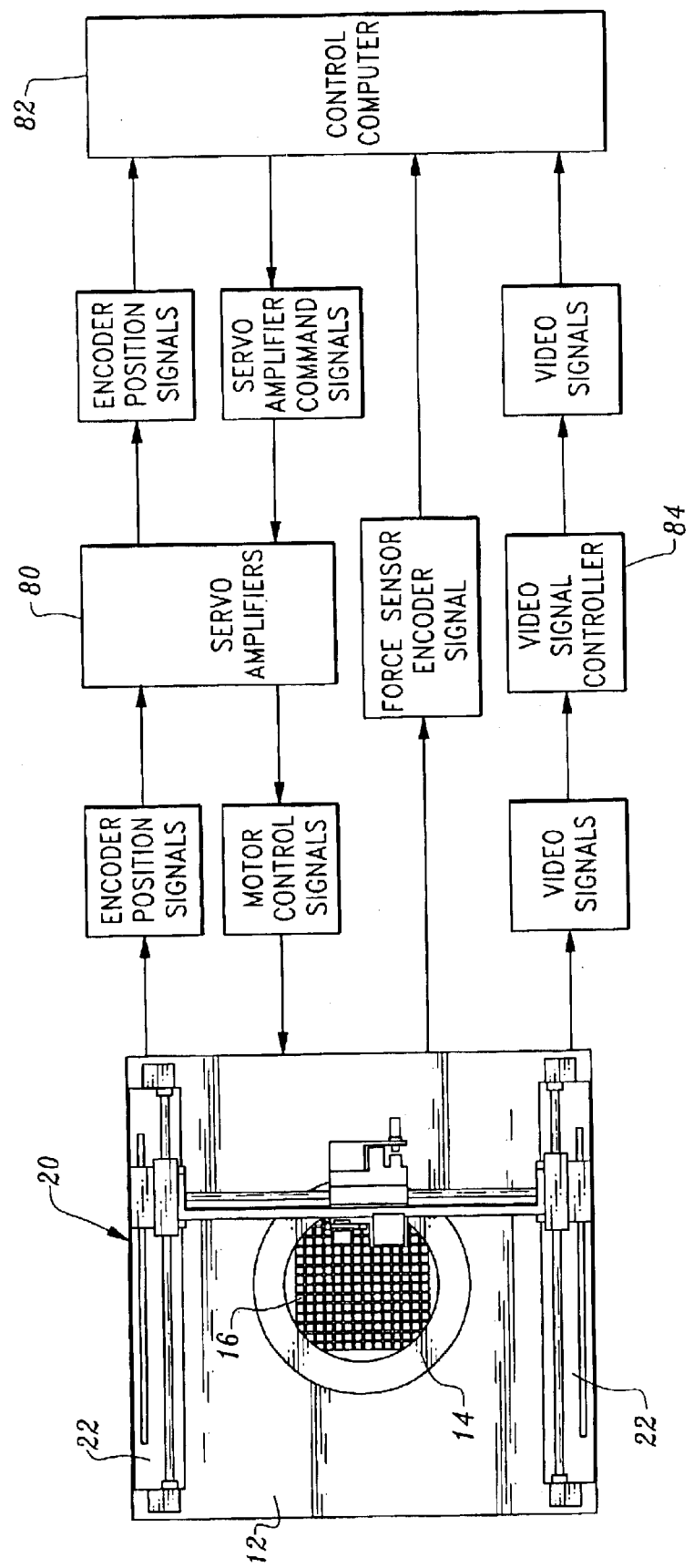
FIG. 12 is a diagrammatic presentation of the control system utilized in the invention.

FIG. 12 is a simplified drawing of the control system used in this invention. The mechanism described above is connected by appropriate cables to servo amplifiers 80 and a control computer or controller 82. Video signals from the video camera 72 on the microscope 70 are transmitted by appropriate cables to a video signal controller 84, the latter being connected to the control computer 82.

With regard to operation of the apparatus, rotary stage 10 is rotated, allowing circuits or devices on the wafer to be aligned relative to the lateral and distal/proximal motion of the first and second gantry stages. The rotary stage 10 also allows the wafer to be rotated 90 degrees in order to scribe the second direction on the wafer surface, During operation of the apparatus, the rotary stage 10 and wafer are fixed against movement as previously described.

Figure 3:
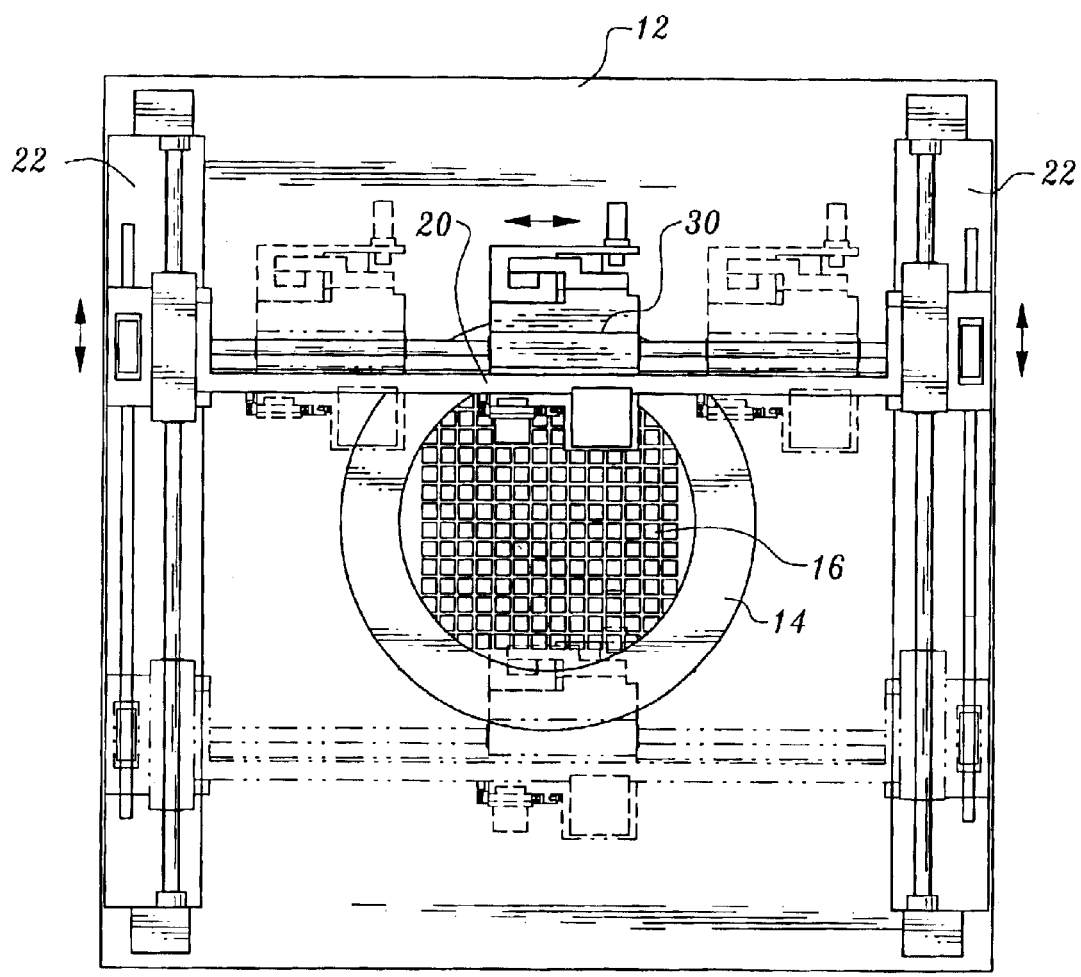
FIG. 3 is a top, plan of the apparatus illustrating representative alternative positions of selected structural components thereof during operation of the apparatus.
Figure 4:
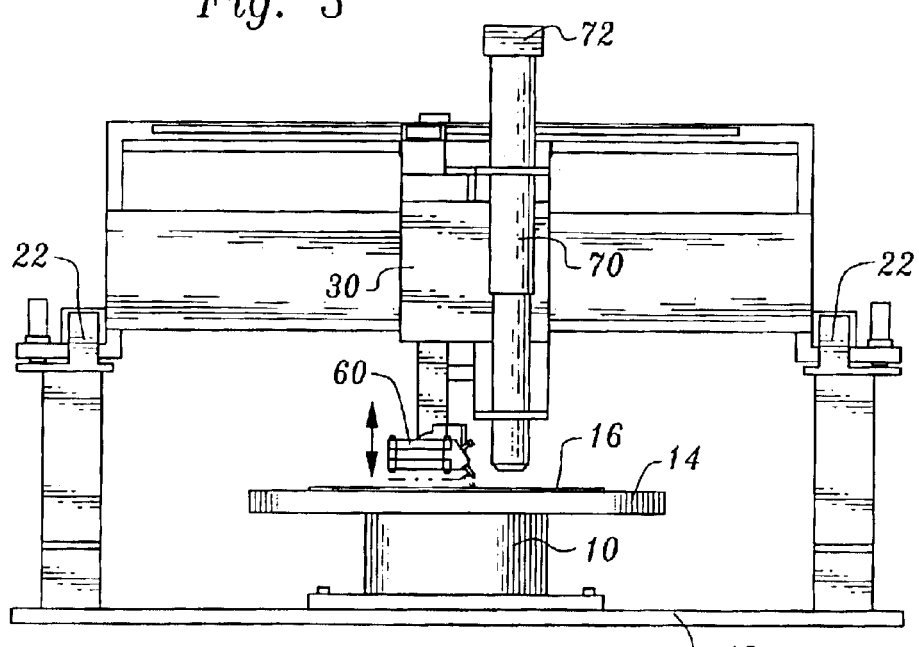
FIG. 4 is a frontal, elevational view of the apparatus.
Figure 9:
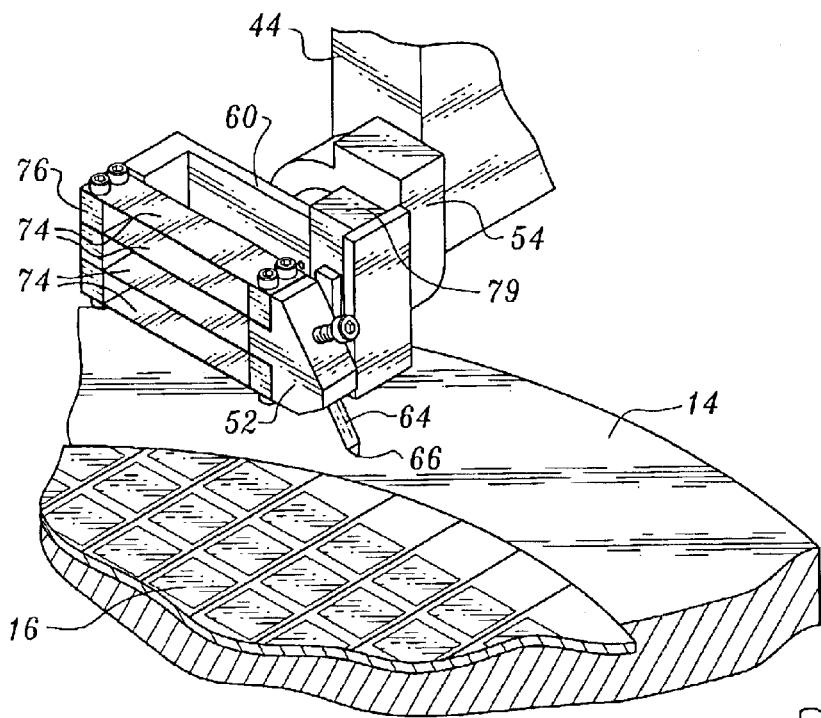
FIG. 9 is a view similar to FIG. 7, but illustrating the scribe and scribe holder in elevated condition relative to the wafer and wafer support.
Figure 10:
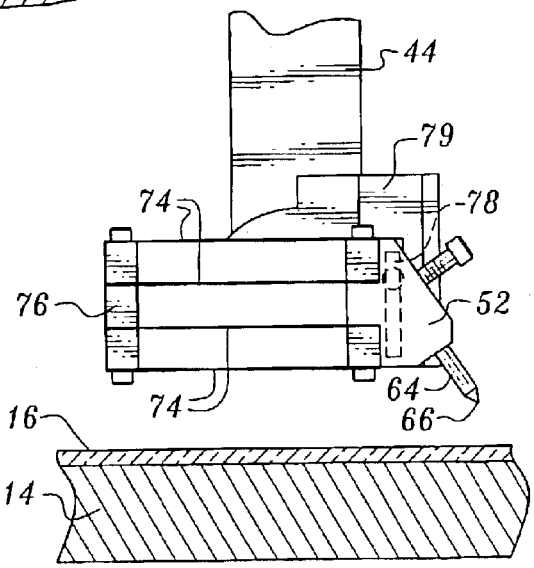
FIG. 10 is a view similar to FIG. 8, but illustrating the scribe and scribe holder in the elevated condition of FIG. 9.
Figure 11:
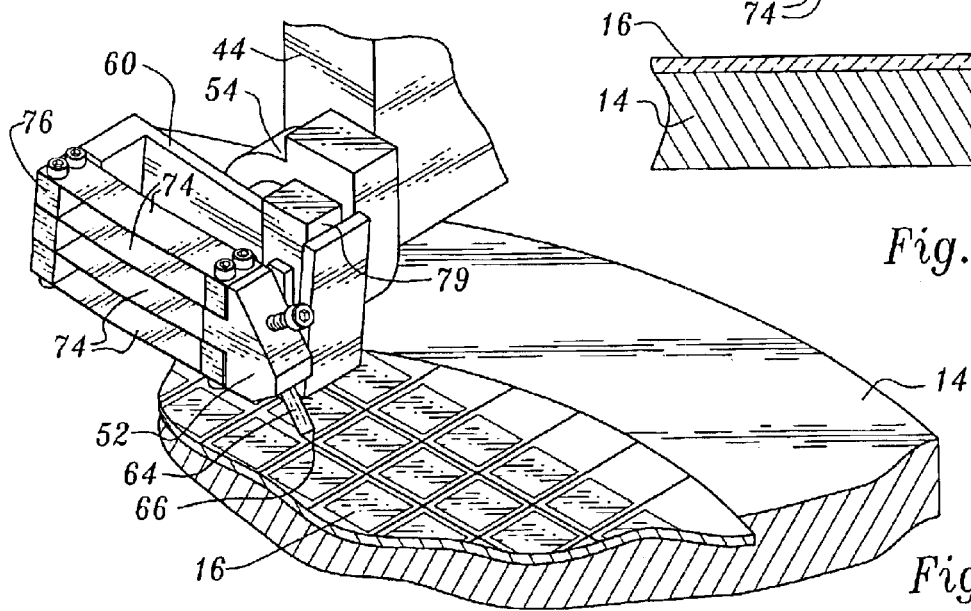
FIG. 11 is a view similar to FIG. 7, but illustrating formation of a second scribe line in the wafer by the scribe.

The lateral motion of the diamond scribe tip relative to the surface of the wafer is effected by the cross stage 30 and the indexing of the diamond scribe from the distal edge of the wafer to the proximal edge of the wafer is effected by the gantry stages comprising stage side segments 22 (see FIG. 3).

The angle at which the diamond scribe tip addresses the wafer surface is effected by the small rotary stage 54. The vertical stage 40 of the gantry provides the means to raise and lower the diamond scribe tip relative to the wafer surface as well as to control the force that the diamond scribe tip applies to the wafer (see FIGS. 4, 7–10).

When the diamond scribe tip is pressed into the surface of the wafer, the flexible beams 74 will bend and the tool holder 52 will deflect in direct proportion to the force applied by the diamond scribe tip to the wafer surface (see FIG. 8). This deflection is measured by the encoder 79 reading the encoder scale 78 mounted on the tool holder 52. If the force is smaller than desired, the linear motor 46 of vertical stage 40 is used to move the vertical stage shaft 44 down, thus deflecting the flexible beams 74 by a greater amount and applying a larger force by the diamond scribe tip to the surface of the wafer.

The control system operates by determining the position of each stage in the apparatus by reading the output signal from its associated encoder. These signals are conducted through appropriate cabling to the servo amplifiers 80 where they are used to configure and control the electronic commutation of the motors. The encoder signals are then passed through appropriate cabling to the control computer 82. In the controller 82 the positions of the mechanism stages, as indicated by the associated encoder signals, are compared to the desired positions and command signals are generated that are sent to the appropriate servo amplifiers 80. The servo amplifiers 80 then send the appropriate motor control signals to the stages of the apparatus.

The encoder signal from the force sensor encoder is conducted by appropriate cabling directly to the control computer 82. The control computer 82 analyzes the signal from the force encoder and sends an appropriate servo amplifier command signal to the vertical stage servo amplifier, which in turn then sends the appropriate motor control signal to the vertical stage motor to control the force.

The output signal from the video camera 72 on the microscope 70 is conducted through appropriate cabling to a video signal controller 84. The video signal is then passed to the controller 82 where it is displayed on a computer monitor as well as being used by the computer to implement pattern recognition and machine vision software routines. In addition to the direct monitoring and mechanism control functions it performs, the control computer 82 also contains software routines to select different process conditions and to provide fully automatic sequencing of the motions of the stages of the apparatus to perform the desired scribing process.

Apparatus constructed in accordance with the teachings this invention has exhibited significantly improved performance over what is currently known in the art. The linear speed of the diamond scribe tip relative to the wafer is 5×–10×faster than existing wafer scribing apparatus resulting in a proportional increase in manufacturing efficiency of wafer scribing. Using linear encoders with a resolution of 0.1 micron, the apparatus has a precision of positioning control of a few tenths of microns compared to around 1.0 microns that is currently known in the art. This improved control of the positioning of the diamond scribe tip relative to the surface of the wafer results in more consistent positioning and directional control of the scribe line, which in turn results in a higher yield of successfully cleaved circuits or devices.

To achieve these results, the linear motors used on the gantry side stage segments are Thrusttube motors, model number T1106, manufactured by Copley Controls Corporation. The linear motor used on the gantry cross stage is a Thrusttube motor, model number T1108, manufactured by Copley Controls Corporation. The linear motor used on the vertical stage is a Thrusttube motor, model number T1106, manufactured by Copley Controls Corpoation. The bearings used on the end gantry stages are model number SHS15VUU-324LUP, manufactured by THK Company, Ltd. The encoders used on all of the linear stages and on the force sensor are model number RGH25U15J00A, manufactured by Renishaw Inc.

The flexible beams used in the force measurement portion of this invention may be made of any suitably flexible, resilient material, such as stainless steel, spring steel, titanium, beryllium cooper, etc. In our early investigations, the material chosen was 304 stainless steel. The number of beams used should be greater than 1 to prevent torsion twisting of the beam but can be any greater number. In our early investigations, we chose to use four beams as a good compromise between limiting torsion twisting and achieving reasonable flexure response. Using four beams made from 0.010 inch thick 304 stainless steel resulted in approximately 6 microns of motion measured by the encoder for each gram of force between the diamond scribe tip and the wafer surface. Using a 0.1 micron resolution encoder resulted in 60 encoder counts per gram of force between the diamond scribe tip and the wafer surface. This results in the ability to control the force between the diamond scribe tip and the wafer surface to within a few tenths of a gram. In addition, since the linear encoder is a digital device, it is more tolerant of electrical noise from the motor drive system than an analog device such as a load cell. This improved control of the force between the diamond scribe tip and the surface of the wafer results in more consistent control of scribe line depth and of the stress imparted to the material near the scribe line. This, in turn, results in a higher yield of successfully cleaved circuits or devices.

What is claimed is:

1. Apparatus for scribing semiconductor wafers comprising, in combination:
   a wafer support for rigidly supporting a wafer and maintaining said wafer against movement;
   a scribe tool;
   a scribe tool holder holding said scribe tool;
   support structure supporting said scribe tool holder, said support structure operable to selectively bring said scribe tool into engagement with said wafer and to move said scribe tool relative to said wafer while in engagement therewith and while said wafer is rigidly supported by and maintained against movement by said wafer support to form a scribe line in said wafer, said scribe tool holder including at least one flexible scribe tool holder element located adjacent to said scribe tool and bendable responsive to pressure being exerted on a wafer fixedly held on said wafer support by said scribe tool.

2. The apparatus according to claim 1 wherein said support structure is a multi-stage support structure including a first linear stage comprising a pair of first linear stage side segments disposed at opposed sides of said wafer support for moving said scribe tool holder and scribe tool in a first predetermined direction, a second linear stage extending between and movable relative to said first linear side segments for moving said scribe tool holder and scribe tool in a second predetermined direction, and a third linear stage depending from said second linear stage for moving said scribe tool holder and said scribe tool selectively toward or away from said wafer support.

3. The apparatus according to claim 2 wherein at least one of said linear stages includes a bearing, a linear motor movable relative to said bearing and a linear encoder operatively associated with said linear motor for providing linear encoder output signals indicating the position of said linear motor relative to said bearing to a controller employed to control operation of the multi-stage support structure.

4. The apparatus according to claim 3 wherein said bearing is a rigid elongated member.

5. The apparatus according to claim 4 wherein said bearing is an air bearing.

6. The apparatus according to claim 2 wherein said third linear stage includes a linear motor and a shaft operatively associated with said linear motor and vertically movable with respect thereto, said scribe tool holder being connected to and movable with said shaft in a vertical direction.

7. The apparatus according to claim 6 wherein said shaft is an air bearing.

8. The apparatus according to claim 6 wherein said third linear stage further includes a linear encoder operatively associated with said linear motor and said shaft for providing linear encoder output signals indicating the position of said shaft relative to said linear motor to a controller employed to control operation of the multi-stage support structure.

9. The apparatus according to claim 2 wherein said first linear stage and said second linear stage each include a bearing, a linear motor movable along said bearing and a linear encoder operatively associated with said linear motor and said bearing for providing linear encoder output signals indicating the position of said linear motor relative to said bearing to a controller employed to control operation of said multi-stage support structure, said first and second predetermined directions being orthogonal to one another.

10. The apparatus according to claim 1 wherein said scribe tool holder is selectively rotatably adjustable to adjust the angle at which the scribe tool addresses a surface of a wafer rigidly supported by said wafer support.

11. The apparatus according to claim 1 additionally comprising a sensor operatively associated with said scribe tool holder to sense bending of said at least one flexible scribe holder element.

12. The apparatus according to claim 11 wherein said sensor comprises an encoder for measuring deflection of said scribe holder.

13. The apparatus according to claim 12 wherein said scribe holder includes an encoder scale readable by said encoder.

14. The apparatus according to claim 12 wherein said support structure is a multi-stage support structure including a linear stage for moving said scribe tool holder and said scribe tool selectively toward or away from said wafer support, said encoder comprising part of said linear stage and providing encoder output signals directly proportional to deflection of said scribe tool holder.

15. The apparatus according to claim 14 wherein said linear gantry stage additionally includes a linear motor and a shaft operatively associated with said linear motor and movable with respect thereto, said scribe tool holder being connected to said shaft and movable therewith, movement of said shaft and said scribe tool holder being responsive to output signals from said encoder.

16. The apparatus according to claim 14 wherein said encoder is a digital encoder and wherein said encoder output signals are digital signals.

17. The apparatus according to claim 1 wherein said scribe tool holder includes a plurality of flexible scribe tool holder elements.

18. The apparatus according to claim 17 wherein said flexible scribe tool holder elements comprise substantially parallel, flexible beams cooperable to resist torsional twisting of said scribe tool holder.

19. A method for scribing semiconductor wafers, said method comprising the steps of:

rigidly supporting a wafer on a wafer support;

maintaining said wafer support and wafer against movement;

supporting a scribe tool holder holding a scribe tool from support structure disposed adjacent to said wafer support;

employing said support structure to selectively move said scribe tool holder and selectively bring said scribe tool into engagement with said wafer; and while said scribe tool is in engagement with said wafer and while said wafer is rigidly supported on and maintained against movement by said wafer support, utilizing said support structure to move said scribe tool holder and scribe tool relative to said wafer to form a scribe line in said wafer, said scribe tool holder including at least one flexible scribe tool holder element adjacent to said scribe tool, said method including the step of bending said at least one flexible scribe tool holder element responsive to pressure being exerted on said wafer by said scribe tool.

20. The method according to claim 19 wherein said support structure includes a linear stage including a linear motor, a bearing supporting said linear motor and a linear encoder, said method further comprising the steps of:

utilizing the linear encoder to sense the position of said linear motor on said bearing;

providing output signals from said linear encoder to a controller indicating the position of said linear motor relative to said bearing; and utilizing said controller to selectively reposition said linear motor relative to said bearing.

21. The method according to claim 19 including the step of adjusting the angle at which said scribe tool addresses a surface of the wafer prior to the step of bringing the scribe tool into engagement with said wafer.

22. The method according to claim 19 including the additional step of employing a sensor to sense bending of said at least one flexible scribe tool holder element.

23. The method according to claim 22 wherein said sensor comprises an encoder, said method including utilizing said encoder to measure deflection of said scribe tool holder.

24. The method according to claim 23 wherein said support structure is a multi-stage support member including a linear stage, said method including employing said linear stage to move said scribe tool holder and said scribe tool selectively toward or away from said wafer support and wafer, said method further including utilizing said encoder to generate encoder output signals sent to a controller directly proportional to deflection of said scribe holder when said scribe engages the wafer, and responsive to receipt of said encoder output signals by said controller, utilizing said controller to control operation of said linear stage to selectively vary the pressure exerted by said scribe tool on said wafer.

25. The method according to claim 24 wherein said encoder is a digital encoder and wherein said output signals are digital signals.

* * * * *